(12) United States Patent
Henderson et al.

(10) Patent No.: US 7,934,607 B2
(45) Date of Patent: May 3, 2011

(54) UNIVERSAL RACK MOUNT MECHANISM

(75) Inventors: Gregory Henderson, Round Rock, TX (US); Robert B. Brownell, Jr., Decatur, GA (US); Lawrence E. Davis, Atlanta, GA (US); Jeffrey E. Neaves, Duluth, GA (US); Lesley Ribble, Marietta, GA (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 11/688,339

(22) Filed: Mar. 20, 2007

(65) Prior Publication Data
US 2008/0230496 A1  Sep. 25, 2008

(51) Int. Cl.
*A47B 96/06* (2006.01)
*A47B 96/07* (2006.01)

(52) U.S. Cl. ............... 211/26; 211/175; 248/220.21; 312/334.4

(58) Field of Classification Search ............... 211/26, 211/175, 190–192, 207, 208; 248/131, 220.21, 248/220.31, 220.42, 222.52, 224.8, 225.21; 312/223.1, 265.1–265.4, 334.4, 334.5; 361/683, 361/724–727, 740–759, 796–802, 829
See application file for complete search history.

(56) References Cited

U.S. PATENT DOCUMENTS

| | | | | |
|---|---|---|---|---|
| 314,808 A * | 3/1885 | Denecke | ....................... | 248/121 |
| 1,898,835 A * | 2/1933 | Henderson | ................. | 248/311.2 |
| 2,914,286 A * | 11/1959 | Weaver | ......................... | 248/265 |
| 2,974,918 A * | 3/1961 | Volgtlander | ................... | 248/201 |
| 3,417,872 A * | 12/1968 | Garth | ............................ | 211/59.1 |
| 3,540,686 A * | 11/1970 | Bryse | .......................... | 248/279.1 |
| 3,704,850 A * | 12/1972 | Hendrickson et al. | ...... | 248/188.5 |
| 4,212,445 A * | 7/1980 | Hagen | ............................ | 248/245 |
| 4,957,255 A * | 9/1990 | John | ........................ | 248/220.21 |
| 5,400,958 A * | 3/1995 | Walker | ............................ | 232/39 |
| 5,529,273 A * | 6/1996 | Benthin | .......................... | 248/254 |
| 5,571,256 A * | 11/1996 | Good et al. | ...................... | 211/26 |
| 5,586,003 A * | 12/1996 | Schmitt et al. | ................ | 361/683 |
| 5,588,728 A * | 12/1996 | Eldridge et al. | ............ | 312/332.1 |
| 5,624,167 A * | 4/1997 | Katz | .......................... | 312/223.1 |
| 5,833,337 A * | 11/1998 | Kofstad | ..................... | 312/334.5 |
| 6,185,092 B1 * | 2/2001 | Landrum et al. | .............. | 361/683 |
| 6,223,908 B1 * | 5/2001 | Kurtsman | ....................... | 211/26 |
| 6,230,903 B1 * | 5/2001 | Abbott | ............................ | 211/26 |
| 6,234,328 B1 * | 5/2001 | Mason | ....................... | 211/90.02 |
| 6,302,280 B1 * | 10/2001 | Bermes | ........................ | 211/70.6 |

(Continued)

OTHER PUBLICATIONS www.dictionary.com, Jul. 20, 2009, http://dictionary.reference.com/browse/journal.*

*Primary Examiner* — Darnell M Jayne
*Assistant Examiner* — Joshua Rodden
(74) *Attorney, Agent, or Firm* — Hamilton & Terrile, LLP; Gary W. Hamilton

(57) ABSTRACT

A system and method are described for a variable mount arm assembly for installing support structures within different types of rack systems. Embodiments of the invention disclose a rack system support member comprising a rotatable bracket having first and second mounting interfaces on first and second mounting faces of the bracket. The rotatable bracket can be secured in a first position to mount the support member in a rack system that uses the first mounting interface. The bracket can be released from the first position and rotated to a second position to mount the support member in a rack system that employs the second mounting interface.

12 Claims, 7 Drawing Sheets

U.S. PATENT DOCUMENTS

| | | | |
|---|---|---|---|
| 6,330,161 B1 * | 12/2001 | Smith et al. | 361/724 |
| 6,347,777 B1 * | 2/2002 | Webber et al. | 248/354.1 |
| 6,409,029 B1 * | 6/2002 | Bermes | 211/70.6 |
| 6,422,399 B1 * | 7/2002 | Castillo et al. | 211/26 |
| 6,424,534 B1 | 7/2002 | Mayer et al. | 361/724 |
| 6,497,395 B1 * | 12/2002 | Croker | 248/300 |
| D469,084 S | 1/2003 | Frank | D14/313 |
| 6,538,879 B2 * | 3/2003 | Jiang | 361/683 |
| 6,551,226 B1 * | 4/2003 | Webber et al. | 482/148 |
| 6,554,142 B2 | 4/2003 | Gray | 211/26 |
| 6,578,939 B1 * | 6/2003 | Mayer | 312/334.5 |
| 6,580,617 B2 | 6/2003 | Kao | 361/759 |
| 6,614,651 B2 * | 9/2003 | Chi et al. | 361/683 |
| 6,615,992 B1 * | 9/2003 | Lauchner et al. | 211/26 |
| 6,648,152 B2 * | 11/2003 | Bermes | 211/70.6 |
| 6,655,534 B2 * | 12/2003 | Williams et al. | 211/26 |
| 6,659,577 B2 * | 12/2003 | Lauchner | 312/334.5 |
| 6,665,178 B2 * | 12/2003 | Curlee et al. | 361/687 |
| 6,666,340 B2 | 12/2003 | Basinger et al. | 211/26 |
| 6,666,414 B2 * | 12/2003 | Dean et al. | 248/27.3 |
| 6,702,124 B2 * | 3/2004 | Lauchner et al. | 211/26 |
| 6,736,277 B2 * | 5/2004 | Lauchner et al. | 211/26 |
| 6,749,275 B2 * | 6/2004 | Cutler et al. | 312/334.4 |
| 6,773,080 B2 * | 8/2004 | Chen et al. | 312/265.1 |
| 6,788,544 B1 * | 9/2004 | Barsun et al. | 361/727 |
| 6,817,487 B2 | 11/2004 | Ross | 222/145.5 |
| 6,826,055 B2 * | 11/2004 | Mease et al. | 361/725 |
| 6,830,300 B2 | 12/2004 | Lauchner | 312/334.5 |
| 6,862,187 B2 * | 3/2005 | Robbins et al. | 361/725 |
| 6,863,188 B2 * | 3/2005 | Besserer et al. | 211/183 |
| 6,866,154 B2 * | 3/2005 | Hartman et al. | 211/26 |
| 6,867,966 B2 | 3/2005 | Smith et al. | 361/687 |
| 6,891,727 B2 | 5/2005 | Dittus et al. | 361/724 |
| 6,910,707 B1 * | 6/2005 | Lyng | 280/618 |
| 6,926,378 B2 * | 8/2005 | Greenwald et al. | 312/334.4 |
| 6,929,339 B1 * | 8/2005 | Greenwald et al. | 312/334.4 |
| 6,935,711 B1 * | 8/2005 | Naue et al. | 312/334.4 |
| 6,948,691 B2 * | 9/2005 | Brock et al. | 248/222.13 |
| 6,957,878 B2 * | 10/2005 | Greenwald et al. | 312/334.4 |
| 6,968,606 B2 * | 11/2005 | Fromm et al. | 29/434 |
| 6,988,626 B2 | 1/2006 | Varghese et al. | 211/26 |
| 7,042,721 B2 * | 5/2006 | Olesiewicz et al. | 361/695 |
| 7,093,725 B2 * | 8/2006 | Hartman et al. | 211/26 |
| 7,097,047 B2 * | 8/2006 | Lee et al. | 211/26.2 |
| 7,137,512 B2 * | 11/2006 | Nguyen et al. | 211/26 |
| 7,175,152 B2 * | 2/2007 | Dittmer | 248/221.11 |
| 7,236,370 B2 | 6/2007 | Coglitore et al. | 361/724 |
| 7,281,633 B2 * | 10/2007 | Hartman et al. | 211/26 |
| 7,281,694 B2 * | 10/2007 | Allen et al. | 248/244 |
| 7,322,911 B2 * | 1/2008 | Webber | 482/142 |
| 7,334,762 B2 * | 2/2008 | Dittmer | 248/221.11 |
| 7,357,362 B2 * | 4/2008 | Yang et al. | 248/221.11 |
| 7,365,970 B2 * | 4/2008 | Cheng et al. | 361/683 |
| 7,369,403 B2 * | 5/2008 | Chen et al. | 361/685 |
| 7,434,826 B1 * | 10/2008 | Lambros | 280/508 |
| 2001/0040142 A1 * | 11/2001 | Haney | 211/183 |
| 2003/0019824 A1 * | 1/2003 | Gray | 211/26 |
| 2003/0136749 A1 * | 7/2003 | Williams et al. | 211/26 |
| 2004/0037046 A1 * | 2/2004 | Dittus et al. | 361/724 |
| 2004/0079712 A1 * | 4/2004 | Mayer | 211/26 |
| 2004/0080244 A1 * | 4/2004 | Lowther et al. | 312/205 |
| 2005/0067358 A1 * | 3/2005 | Lee et al. | 211/26 |
| 2005/0155941 A1 * | 7/2005 | Hartman et al. | 211/26 |
| 2006/0061956 A1 * | 3/2006 | Chen et al. | 361/685 |
| 2006/0285286 A1 * | 12/2006 | Littlejohn | 361/683 |
| 2008/0083686 A1 * | 4/2008 | Jones | 211/191 |

* cited by examiner

UNIVERSAL RACK MOUNT MECHANISM

BACKGROUND OF THE INVENTION

1. Field of the Invention

The present disclosure relates in general to the field of information handling systems. More specifically, the present disclosure relates to a rack assembly for supporting information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often stored in a rack system to conserve floor space. A variety of different information handling system components including servers, computers, storage devices such as disk drives, tape drives, and RAID drives, as well as other electrical devices can be housed in rack systems.

Standards such as the Electronics Industry Association (EIA) RS-310 19" rack standard have been developed to standardize the height and width of electronic rack systems to facilitate effective use of the space within rack systems. The vertical space within a rack system is generally defined in vertical mounting unit increments, often referred to as "U's." A mounting unit or U is typically 1.75 inches. Interior rails of rack systems often have three mounting slots selectively spaced within each U of vertical space for attaching components. Rack systems and components are typically sized in mounting unit increments. For example, "2U" components are sized to fit within a 2U vertical space; "48U" and "72U" racks are sized to have 48U and 72U, respectively, of usable vertical space.

Access to components is often provided by a slideable shelf, slideable arms, or other support structures attached to interior rails of the rack system. These structures allow the associated components to slide forward for maintenance, repair, or installation.

Electronic rack systems employ a number of different mounting interface configurations for securing shelf rail arms and other support structures in the rack. For example, Dell Computer offers RAPIDRAIL™ system components for installation in square-holed rack systems and VERSA-RAIL™ system components for installation in round-holed rack systems. Manufacturers typically stock separate component kits for the different mounting components, thereby incurring inventory costs and high missing, wrong and damaged (MWD) metrics due to the customer inadvertently ordering the wrong type of components or the factory sending the wrong components. In view of the foregoing, it is apparent that there is a need for rack system components that provide multiple types of mounting interfaces and can be quickly converted from one mounting interface to another mounting interface. Furthermore, there is a need for rack system components that can be converted from one mounting interface to another without the use of tools.

SUMMARY OF THE INVENTION

In accordance with teachings of the present disclosure, a system and method are described for a variable mount arm assembly for installing support structures within different types of rack systems. More specifically, embodiments of the invention disclose a rack system support member comprising a rotatable bracket having first and second mounting interfaces on first and second mounting faces of the bracket. The rotatable bracket can be secured in a first position to mount the support member in a rack system that uses the first mounting interface. The bracket can be released from the first position and rotated to a second position to mount the support member in a rack system that employs the second mounting interface.

The first bracket interface may include two hooks formed to interface with a rectangular hole-type rail interface and may also include a latch assembly to provide an attachment to the rail interface. The second bracket mounting surface may include at least one aperture formed to interface rack systems using a round hole-type rail mounting interface.

In one embodiment of the invention, the first and second mounting faces of the bracket are disposed on opposite ends of the rotatable bracket and the bracket is rotated one hundred eighty degrees (180°) to change the mounting configuration of the bracket from the first mounting interface to the second mounting interface. In another embodiment of the invention, the first and second mounting faces of the bracket are disposed on adjacent sides of the rotatable bracket and the bracket is rotated ninety degrees (90°) to change the mounting configuration of the bracket from the first mounting interface to the second mounting interface.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A system and method are described for a variable mount arm assembly for installing support structures within different types of rack systems for supporting components. More specifically, embodiments of the invention disclose a rack system support member comprising a rotatable bracket having first and second mounting interfaces on first and second mounting faces. The system and method described herein can be used to provide effective and economical rack systems for storing information handling systems.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1A:
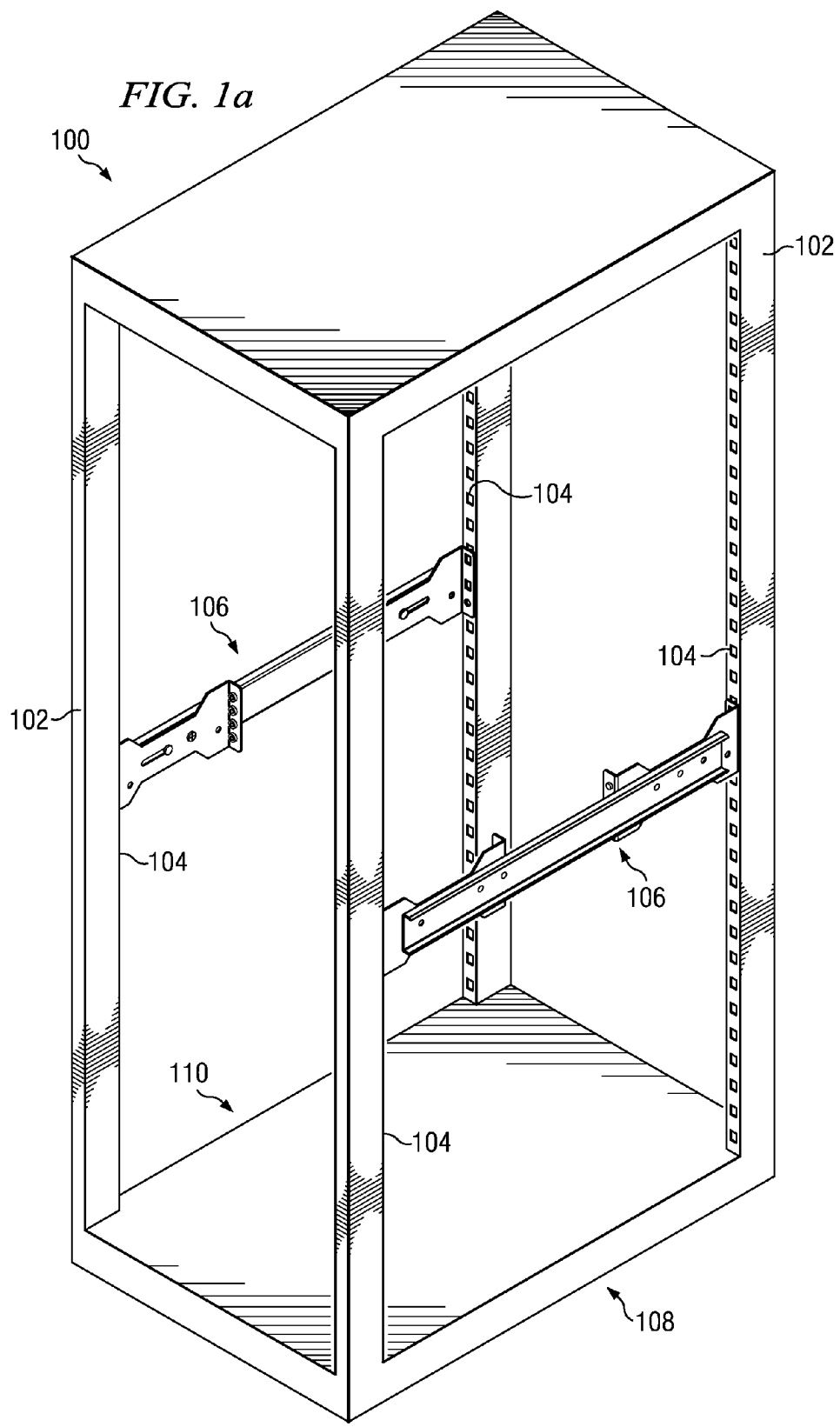
FIG. 1a is a generalized illustration of a rack system for storing information handling systems.
Figure 2A:
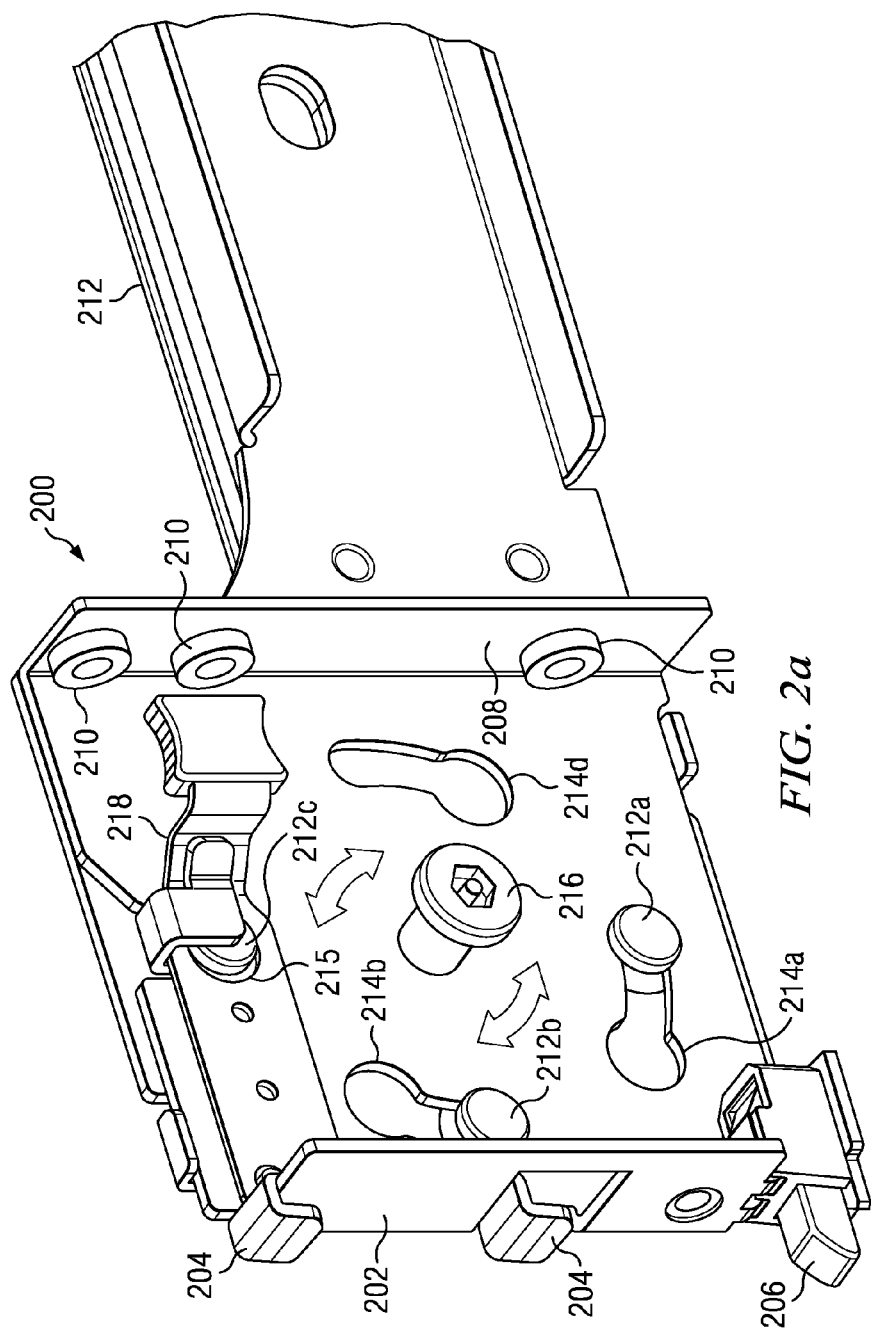
FIGS. 2a-d show a rotatable bracket having dual mounting interfaces in accordance with embodiments of the present invention.

FIG. 1a shows an embodiment of a rack system that can be used to implement the improved system and method of the present disclosure. Rack system 100 includes a plurality of rails 102. Rails 102 are generally aligned along first side 108 and second side 110 of rack 100. Each rail 102 preferably includes standard rail interface 104, which may include a plurality of apertures or mounting slots. In certain embodiments, standard rail interface 104 may comply with a rack standard such as the EIA RS 310 standard or with a rack standard such as the EIA-310-D.

The rack system 100 further includes arm assemblies 106 that attach to the standard rail interface portions 104 of rack 100 and are operable to support components stored in rack 100. Components stored in the rack system 100 can include information handling system components, such as servers, disk drives, tape drivers, RAID drives, monitors, keyboards, routers or other suitable equipment. Arm assemblies 106 may include slide assemblies (not expressly shown) for supporting components that are movable between an extended position and a retracted position. A component secured to slide assembly may be accessed for installation, removal, maintenance or repair while extended from the rack and later stored within the rack with slide assembly in the retracted position.

Figure 1B:
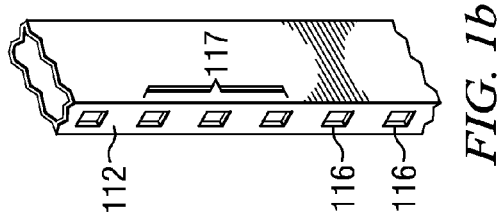
FIG. 1b shows a segment of a rack system rail interface having a rectangular hole-type interface.

FIG. 1b shows a first rail interface 112 that includes generally rectangular holes 116 arranged into defined standard mounting units, or "U's" 117. In one embodiment, rectangular holes 116 are in accordance with EIA standard EIA-310-D. Each standard mounting unit is typically made up of three holes spaced in accordance with an industry standard such as EIA standard EIA-310-D.

Figure 1C:
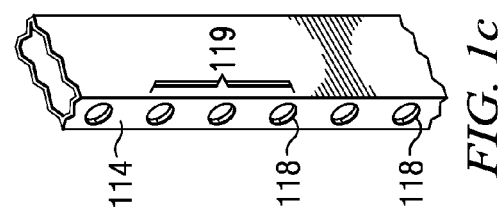
FIG. 1c shows a segment of a rack system rail interface having a rounded hole-type interface.

FIG. 1c shows a second rail interface 114 that includes generally rounded-type holes 118 arranged into mounting units, or U's 119. In one embodiment, rounded holes 118 are formed in accordance with EIA standard EIA-310-D. Further round holes 118 may include tapped holes to facilitate the attachment of arm assemblies 106 to rails 102. Alternative embodiments may include additional standard rail interface types.

FIGS. 2a-d are illustrations of a support member used in a rack system in accordance with embodiments of the invention. Various embodiments of the invention comprise a rotatable bracket 200 having a first mounting surface 202 comprising a first mounting interface and a second mounting surface 208 comprising a second mounting interface. In the embodiment shown in FIG. 2a, the bracket 200 is generally U-shaped with mounting surface 202 comprising a mounting interface comprising hooks 204 and a lock button 206. Mounting surface 208 comprises a plurality of keyhole apertures 210 that can be used to facilitate mounting of the bracket using clench nuts. The rotating bracket 200 is secured to a support arm 212 using a plurality of standoffs 212a-c that are received in keyhole apertures in the rotatable bracket 200. The rotatable bracket is journaled for rotation on a pivot post 216 and is secured in a predetermined position by a lock spring 218.

Figure 2B:
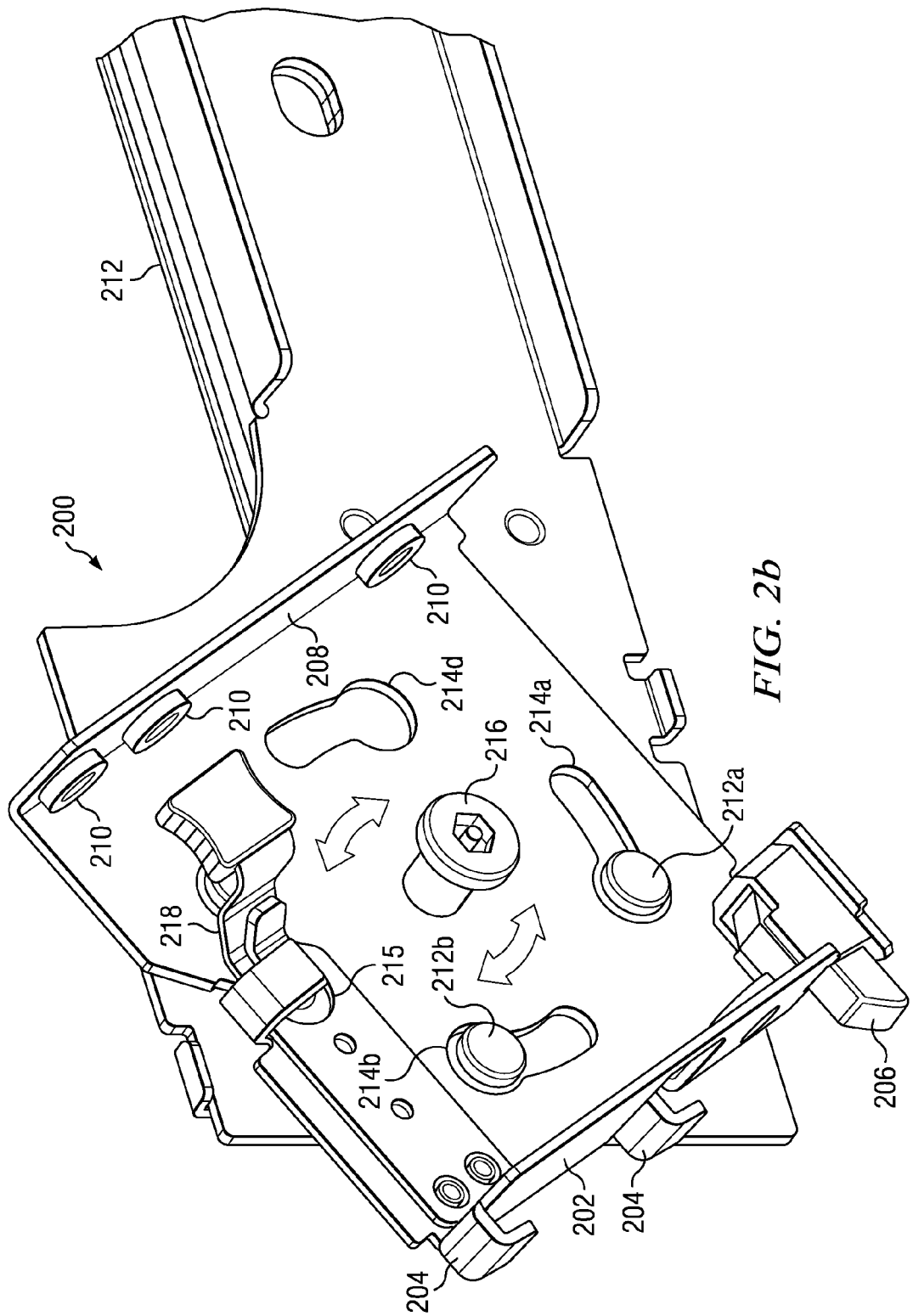
Figure 2C:
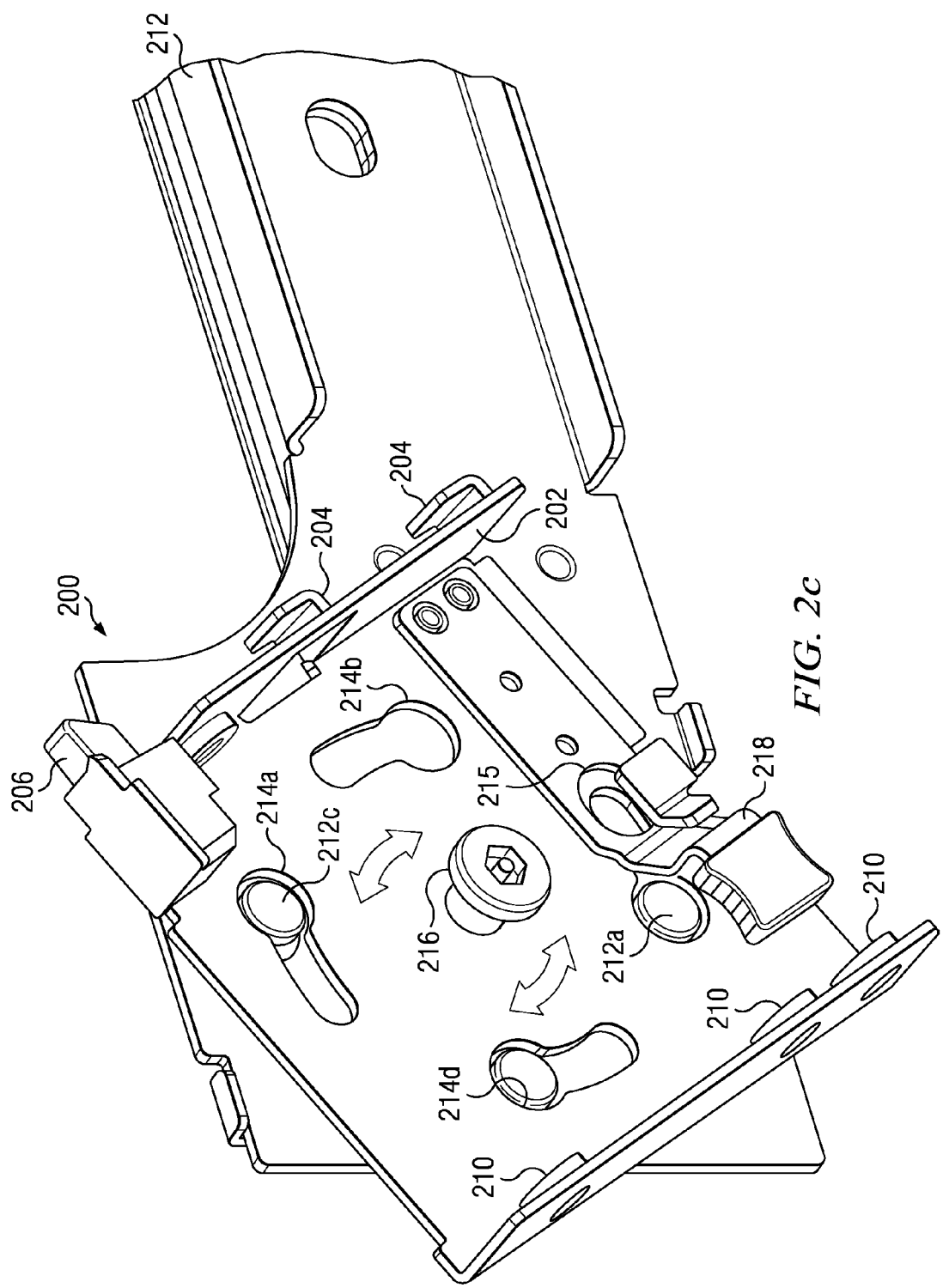
Figure 2D:
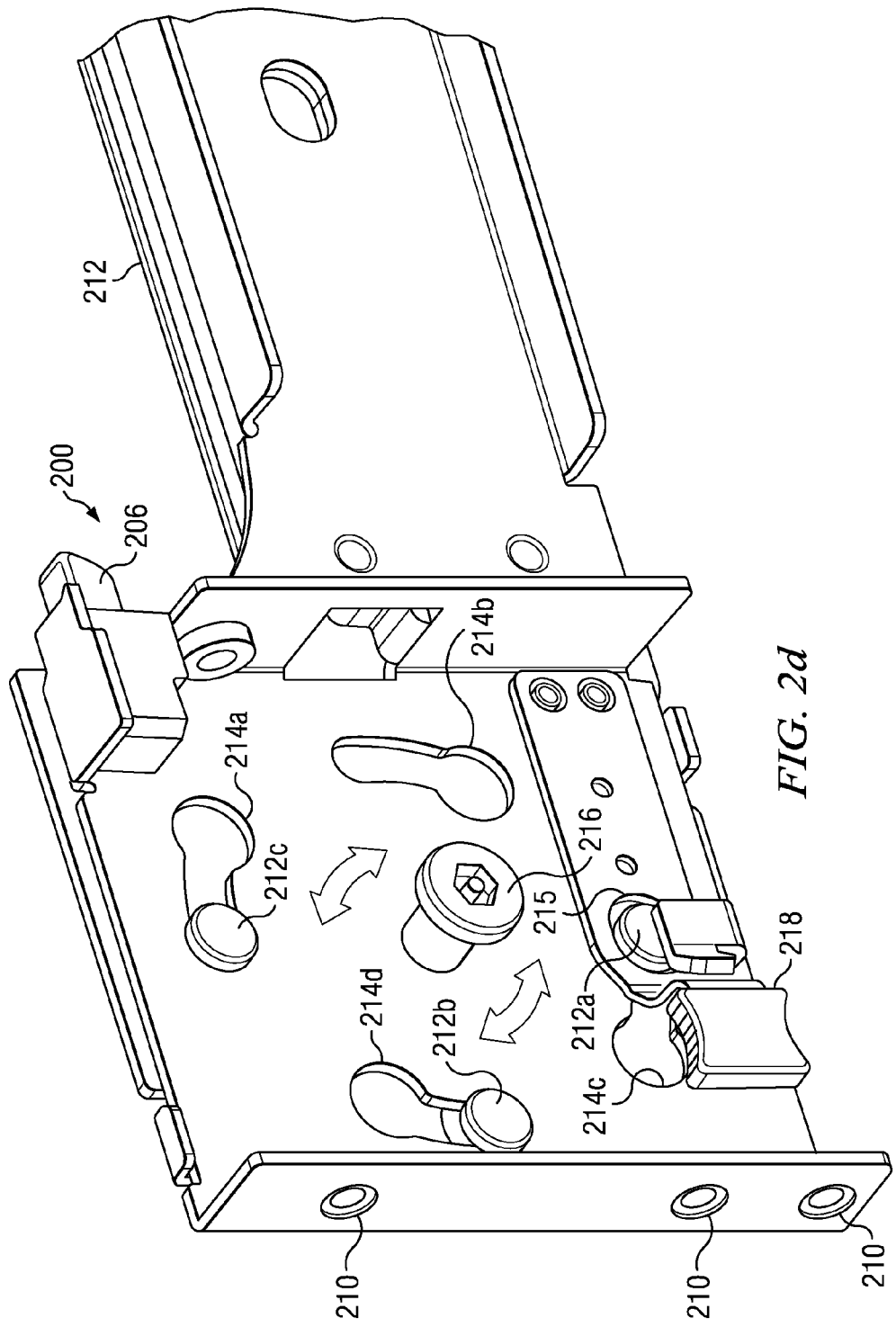
Figure 2E:
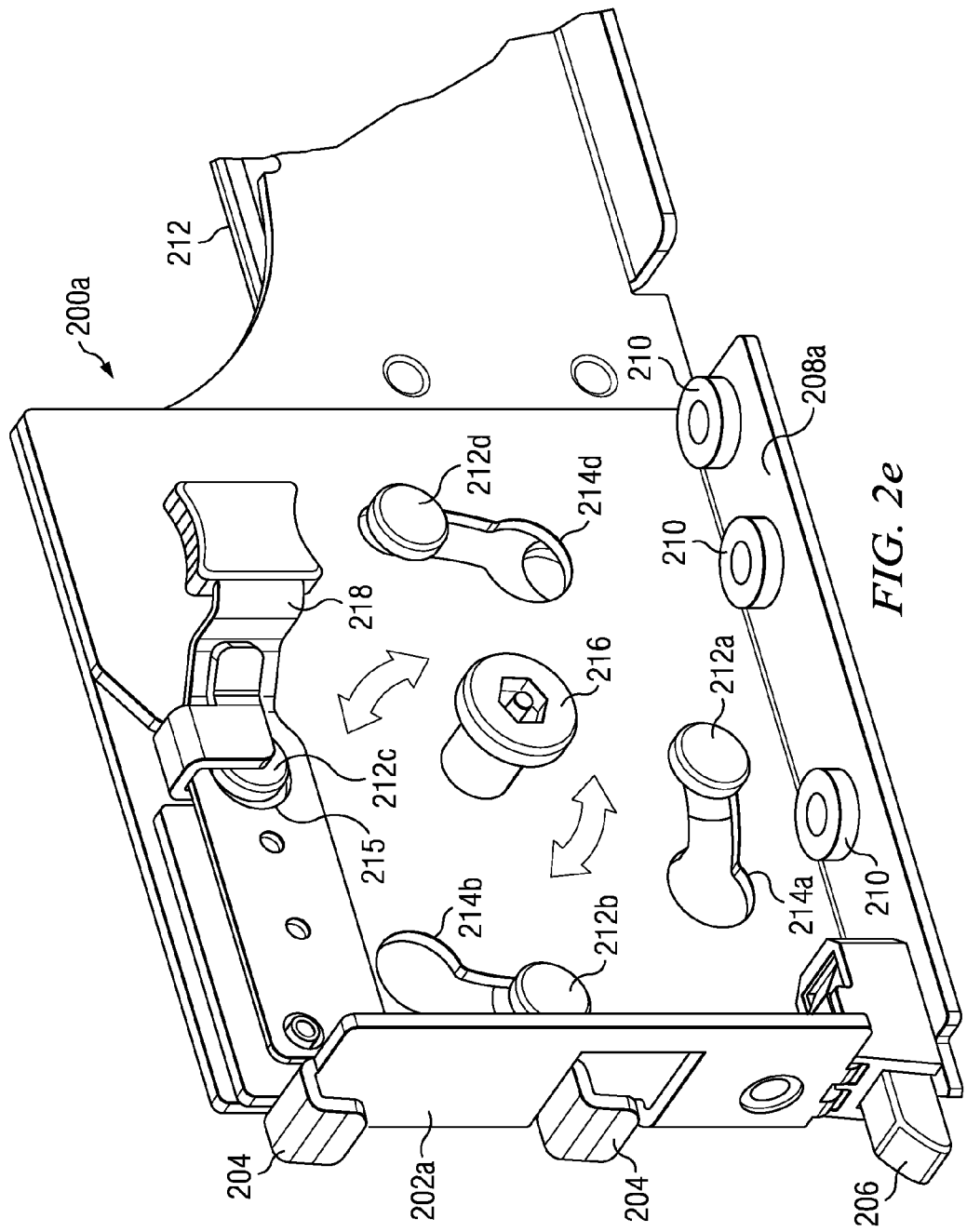
FIGS. 2e-f show another embodiment of a rotatable bracket having dual mounting interfaces in accordance with embodiments of the present invention.
Figure 2F:
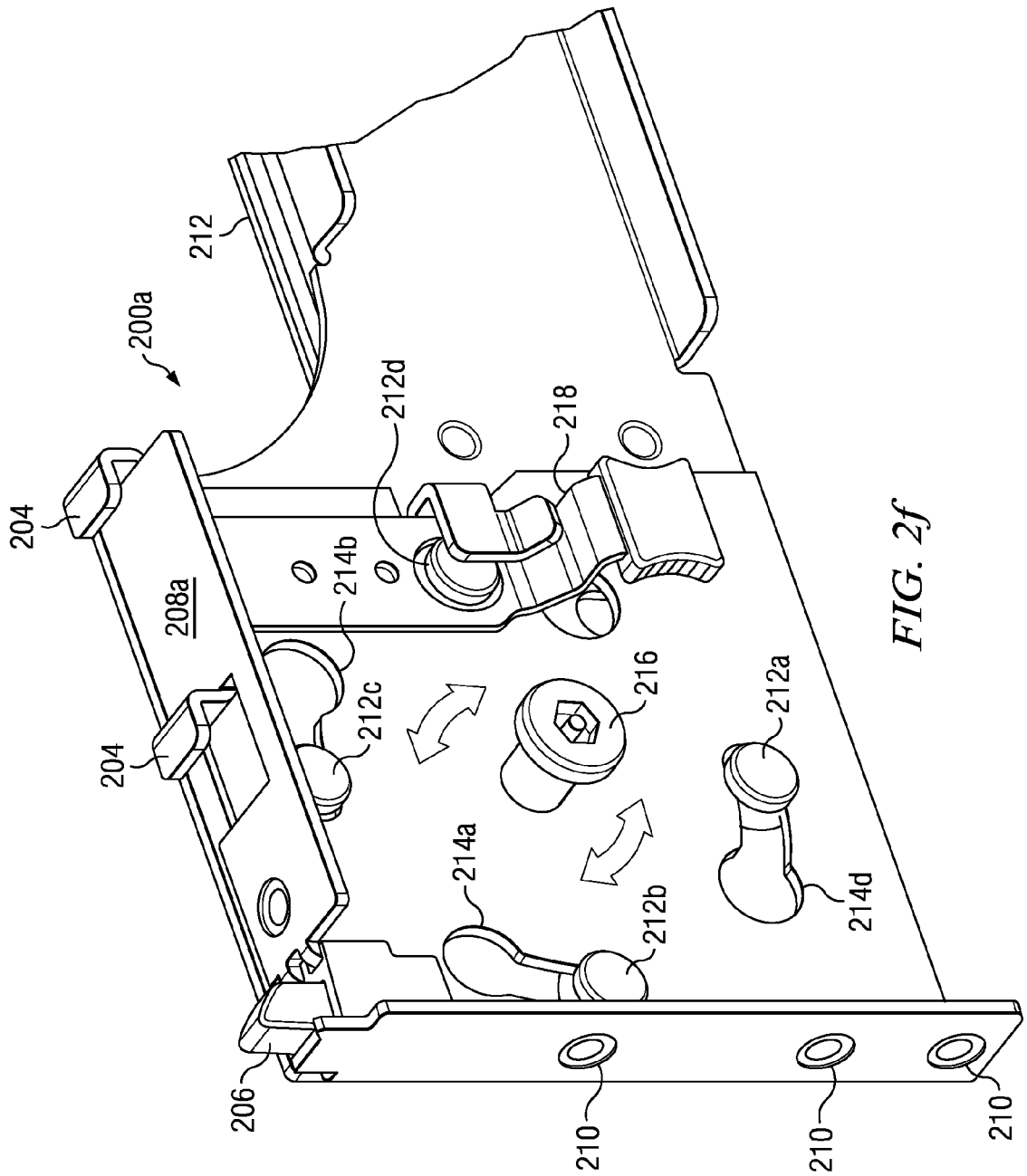

Conversion of the rotating bracket from a first mounting interface to a second mounting interface can be understood by referring to FIGS. 2b-d. The conversion process is initiated by lifting the lock spring outward to allow the rotatable bracket 200 to rotate on the pivot post 216. The rotatable bracket 200 is rotated to a position wherein standoffs 212a-c are positioned in the larger portion of the keyhole apertures 214a-c. The rotatable bracket 200 is then moved outward, away from the support arm 212, to allow the standoffs 212a-c to pass through the large portion of the keyhole apertures 214a-c. The bracket 200 is then rotated on pivot post 216 one hundred eighty degrees (180°) to the position shown in FIG. 2c with the standoffs 212a, 212b and 212c aligned, respectively, with the larger portions of the keyhole apertures 214c, 214d and 214a. The rotatable bracket 200 is then moved toward the support arm 212 to allow the standoffs 212a, 212b and 212c to pass through the larger portions of the keyhole apertures 214c, 214d and 214a, respectively. The rotatable bracket 200 is then rotated to the position shown in FIG. 2d. In this position, the rotatable bracket is secured to the support arm 212 by the standoffs 212a, 212b and 212c which are captured in the smaller portions of the keyhole apertures 214c, 214d and 214a, respectively. The bracket is locked in this configuration by a securing standoff 212a in an aperture 215 in the spring lock 218.

In an alternate embodiment of the invention, the first and second mounting faces 202a and 208a of the bracket are disposed on adjacent sides of the rotatable bracket 200a. In this embodiment of the invention, the rotatable bracket 200a comprises the same features described hereinabove, with the exception of the location of the second mounting surface on an adjacent side that is offset 90° with respect to the first mounting surface. Mounting surface 208a comprises a plurality of keyhole apertures 210 that can be used to facilitate mounting of the bracket using clench nuts. The rotating bracket 200a is secured to a support arm 212 using a plurality of standoffs 212a-d that are received in keyhole apertures in the rotatable bracket 200. The rotatable bracket is journaled for rotation on a pivot post 216 and is secured by a lock spring 218.

The mounting configuration of this embodiment can be changed using a technique similar to that describe above with respect to FIGS. 2b-d, with the exception of rotating the bracket 200a by 90° rather than 180° to change the mounting configuration of the bracket from the first mounting interface to the second mounting interface.

Skilled practitioners in the art will recognize that many other embodiments and variations of the present invention are possible. In addition, each of the referenced components in this embodiment of the invention may be comprised of a plurality of components, each interacting with the other in a distributed environment. Furthermore, other embodiments of the invention may expand on the referenced embodiment to extend the scale and reach of the implementation described herein.

What is claimed is:

1. A rack system comprising:
   a rack having a plurality of rails each having a mounting interface;
   a first arm assembly comprising:
      an arm having a first end and a second end, said arm having a post and a plurality of standoffs mounted thereon;
      a mounting bracket releasably secured to the first end of the arm by said standoffs, said mounting bracket comprising a first mounting interface and a second mounting interface, said mounting bracket being laterally slidable on said post between a secured position and a rotatable position wherein each standoff passes through a respective aperture in said bracket and said bracket is journaled for rotation on said post between a first bracket position wherein said first mounting interface is disposed at a distal end of said arm and a second bracket position wherein said second mounting interface is disposed at said distal end of said arm; and
      a releasable lock, securing said mounting bracket in said first bracket position or said second bracket position wherein said releasable lock comprises a spring actuated lock operable to be lifted to releasably lock said bracket to one of said standoffs.

2. The rack system of claim 1, wherein the first mounting interface comprises at least two hooks formed to interface with an interface portion of a rail.

3. The rack system of claim 1, wherein the second mounting interface comprises at least two apertures for interfacing with an interface portion of a rail.

4. The rack system of claim 1, wherein the arm assembly further comprises a slide assembly coupled to the arm and selectively moveable between an extended position and a retracted position.

5. The rack system of claim 1, further comprising a component supported by the first arm assembly, wherein the component comprises an information handling system.

6. A method for installing an arm assembly within a rack system comprising:
   releasably securing a mounting bracket to an arm assembly with a plurality of standoffs, said arm having a post secured thereon, said mounting bracket comprising a first mounting interface and a second mounting interface, said mounting bracket being laterally slidable on said post between a secured position and a rotatable position wherein each standoff passes through a respective aperture in said bracket and wherein said bracket is journaled for rotation on said post between a first bracket position wherein said first mounting interface is disposed at a distal end of said arm and a second bracket position wherein said second mounting interface is disposed at said distal end of said arm;
   laterally sliding said bracket on said post to said rotatable position;
   rotating said mounting bracket to a position wherein one of said first or second interfaces is disposed at said distal end of said mounting arm;
   laterally sliding said bracket on said post to said secured position; and
   using a releasable lock to secure said mounting bracket in said first bracket position or said second bracket position, wherein said releasable lock comprises a spring actuated lock operable to be lifted to releasably lock said bracket to one of said standoffs.

7. The method of claim 6, wherein the first mounting interface comprises at least two hooks formed to interface with an interface portion of a rail.

8. The method of claim 6, wherein the second mounting interface comprises at least two apertures for interfacing with an interface portion of a rail.

9. The method of claim 6, wherein said mounting bracket selectively rotates between the first bracket position and the second bracket position around a central pivot formed in the bracket between the first position and the second position.

10. The method of claim 6, wherein the arm assembly further comprises a slide assembly coupled to the arm and selectively moveable between an extended position and a retracted position.

11. The method of claim 6, further comprising using said arm to support a component.

12. The method of claim 11, wherein said component comprises an information handling system.

* * * * *